(12) United States Patent
Emma et al.

(10) Patent No.: US 7,290,203 B2
(45) Date of Patent: Oct. 30, 2007

(54) DYNAMIC MEMORY ARCHITECTURE EMPLOYING PASSIVE EXPIRATION OF DATA

(75) Inventors: Philip George Emma, Danbury, CT (US); Robert Kevin Montoye, Austin, TX (US); William Robert Reohr, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 553 days.

(21) Appl. No.: 10/977,432

(22) Filed: Oct. 29, 2004

(65) Prior Publication Data

US 2006/0107090 A1    May 18, 2006

(51) Int. Cl.
*H03M 13/00*    (2006.01)
*G06F 11/00*    (2006.01)

(52) U.S. Cl. .................. 714/809; 714/807; 714/708

(58) Field of Classification Search ............... 714/809, 714/807, 708
See application file for complete search history.

(56) References Cited

U.S. PATENT DOCUMENTS 4,823,307 A * 4/1989 Melgara et al. ............... 714/50
5,128,947 A * 7/1992 Corrigan ..................... 714/816
5,285,454 A * 2/1994 Blaum et al. ................ 714/752
6,389,505 B1    5/2002 Emma et al.
6,765,877 B1 * 7/2004 Foschiano et al. .......... 370/250

OTHER PUBLICATIONS

Z. Hu et al., "Let Caches Decay: Reducing Leakage Energy via Exploitation of Cache Generational Behavior," ACM Transactions on Computer Systems (TOCS), pp. 1-29, May 2002.
J.M. Berger, "A Note on Error Detection Codes for Asymmetric Channels," Information and Control 4, pp. 68-73, Mar. 1961.

* cited by examiner

*Primary Examiner*—Joseph D. Torres
(74) *Attorney, Agent, or Firm*—Ryan Mason & Lewis

(57) ABSTRACT

Apparatus for passively tracking expired data in a dynamic memory includes an error encoding circuit operative to receive an input data word and to generate an encoded data word which is stored in the dynamic memory. The apparatus further includes a decoding circuit operative to receive an encoded data word from the dynamic memory, to detect at least one or more unidirectional errors in the input data word read from the dynamic memory, and to generate an error signal when at least one error is detected, the error signal indicating that the input data word contains expired data. Control circuitry included in the apparatus is configured for initiating one or more actions in response to the error signal.

13 Claims, 5 Drawing Sheets

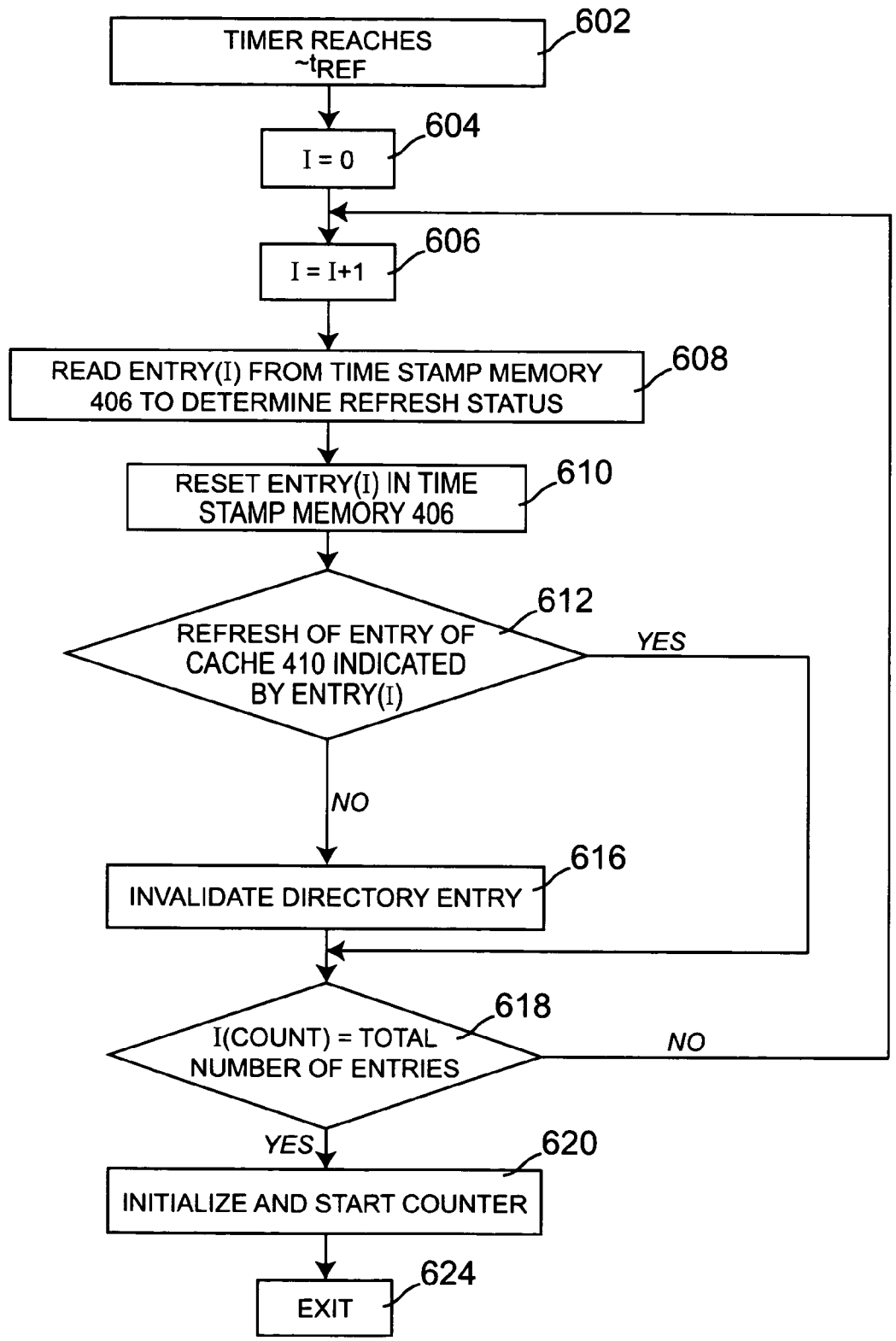

DYNAMIC MEMORY ARCHITECTURE EMPLOYING PASSIVE EXPIRATION OF DATA

FIELD OF THE INVENTION

The present invention relates generally to memory devices, and more particularly relates to dynamic memory implemented in a cache memory hierarchy.

BACKGROUND OF THE INVENTION

Recent trends in processor architecture design often involve adding more processor cores on a given integrated circuit (IC), and enabling more threads per core. This trend has driven the demand for on-chip secondary cache memory, often referred to as Level-2 (L2) cache. As the aggregate processing power of an IC grows, the capacity of the corresponding cache memories must grow accordingly. Hence, there is a renewed demand for very dense (e.g., about one gigabit (Gb) or higher) on-chip storage. While dynamic storage (e.g., dynamic random access memory (DRAM), gain-cells, etc.) provides one of the most dense memory architectures, dynamic storage generally requires periodic refreshing since, over time, finite leakage associated with dynamic memory cells can add or remove enough charge so that it can disturb the respective states of the memory cells.

Variations in certain characteristics of dynamic memory cells (e.g., data retention time, temperature dependence, etc.) generally do not correlate with one another. Thus, the rate at which refreshing occurs in the overall memory is typically based on a worst-case statistical analysis, which often represents an overburden to the processor system. Moreover, after a read operation is performed, the contents of a dynamic memory cell must be restored because the sensing required to detect the state of the memory cell also destroys its contents. Periodic refresh actions also undesirably stall other pending processor requests, thereby reducing memory and/or processing bandwidth. Some of the historical notions relating to dynamic storage, however, are derived from the use of dynamic memory in a persistent memory (e.g., main memory) environment, and may be irrelevant in the context of a cache memory application.

U.S. Pat. No. 6,389,505 issued to P. Emma et al. on May 14, 2002 (hereinafter referred to as "Emma"), the disclosure of which is incorporated by reference herein, challenges the notion that all dynamic memory cells must be periodically refreshed. The Emma patent describes specific techniques which can enable DRAM to be used as cache memory by providing a restore tracking system for reducing the number of refresh actions needed to maintain data in the DRAM. In essence, data in dynamic storage can be left to "expire" in the context of a cache architecture. For example, since DRAM has a destructive read which is generally followed by a restore cycle, the only data that needs to be refreshed is data that has not been referenced in a relatively long period of time (e.g., greater than a retention time of the dynamic memory cell). Data that has not been referenced in a cache is usually considered "dead," and therefore it need not be refereshed if it can be shown that the data contained therein is not likely to be used again (see, e.g., Zhigang Hu et al., "Let Caches Decay: Reducing Leakage Energy via Exploitation of Cache Generational Behavior," *ACM Transactions on Computer Systems* (*TOCS*), May 2002, which is incorporated by reference herein). One disadvantage with this approach, however, is that it requires substantial overhead to administer the restore tracking system so that the system is a priori aware of the fact that certain data in the dynamic memory cells might be erroneous, and to ensure that such data is not inadvertently used.

There exists a need, therefore, for a dynamic memory architecture suitable for use in a cache memory system which does not suffer from one or more of the above-noted deficiencies associated with conventional dynamic storage and/or cache memory architectures.

SUMMARY OF THE INVENTION

In accordance with the aforementioned need, the present invention, in an illustrative embodiment, is an improved dynamic memory architecture that utilizes a unique passive expiration methodology for refreshing data stored in the dynamic memory. The dynamic memory architecture of the invention is well-suited for use in a cache memory environment and does not require the extensive overhead necessary to implement conventional cache memory systems. Consequently, the cost of manufacturing a cache memory in accordance with the techniques of the present invention is substantially reduced.

In accordance with one aspect of the invention, apparatus for passively tracking expired data in a dynamic memory includes an error encoding circuit operative to receive an input data word and to generate an encoded data word which is stored in the dynamic memory. The apparatus further includes a decoding circuit operative to receive an encoded data word from the dynamic memory, to detect at least one or more unidirectional errors in the input data word read from the dynamic memory, and to generate an error signal when at least one error is detected, the error signal indicating that the input data word contains expired data. Control circuitry included in the apparatus is configured for initiating one or more actions in response to the error signal.

In accordance with another aspect of the invention, apparatus for passively tracking expired data in a dynamic memory includes a time stamp memory configurable for storing information relating to a refresh status relating to one or more corresponding data entries in the dynamic memory, and a timer configurable for defining a desired window of time in which a refresh operation of data in the dynamic memory is to occur in order to ensure that the data is valid. Control circuitry coupled to the time stamp memory and to the timer is operative to manage the information stored in the time stamp memory relating to the refresh status of the one or more corresponding data entries in the dynamic memory.

In accordance with another aspect of the invention, a method for passively tracking expired data in a dynamic memory includes the steps of: receiving an input data word; generating an encoded data word based on the input data word and storing the encoded data word as a data entry in the dynamic memory; in response to a requested address, reading a data entry from the dynamic memory corresponding to the requested address; decoding the data entry corresponding to the requested address and detecting whether there are any errors in the data word read from the dynamic memory; and generating an error signal when at least one error is detected in the data word read from the dynamic memory, the error signal indicating that the data word read from the dynamic memory comprises expired data.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 6 is a logical flow diagram depicting an exemplary methodology for resetting time stamps used for tracking a refresh status of data and for invalidating directory entries corresponding to such data, in accordance with the illustrative embodiment of the invention shown in FIG. 4.

DETAILED DESCRIPTION OF THE INVENTION

Figure 1:
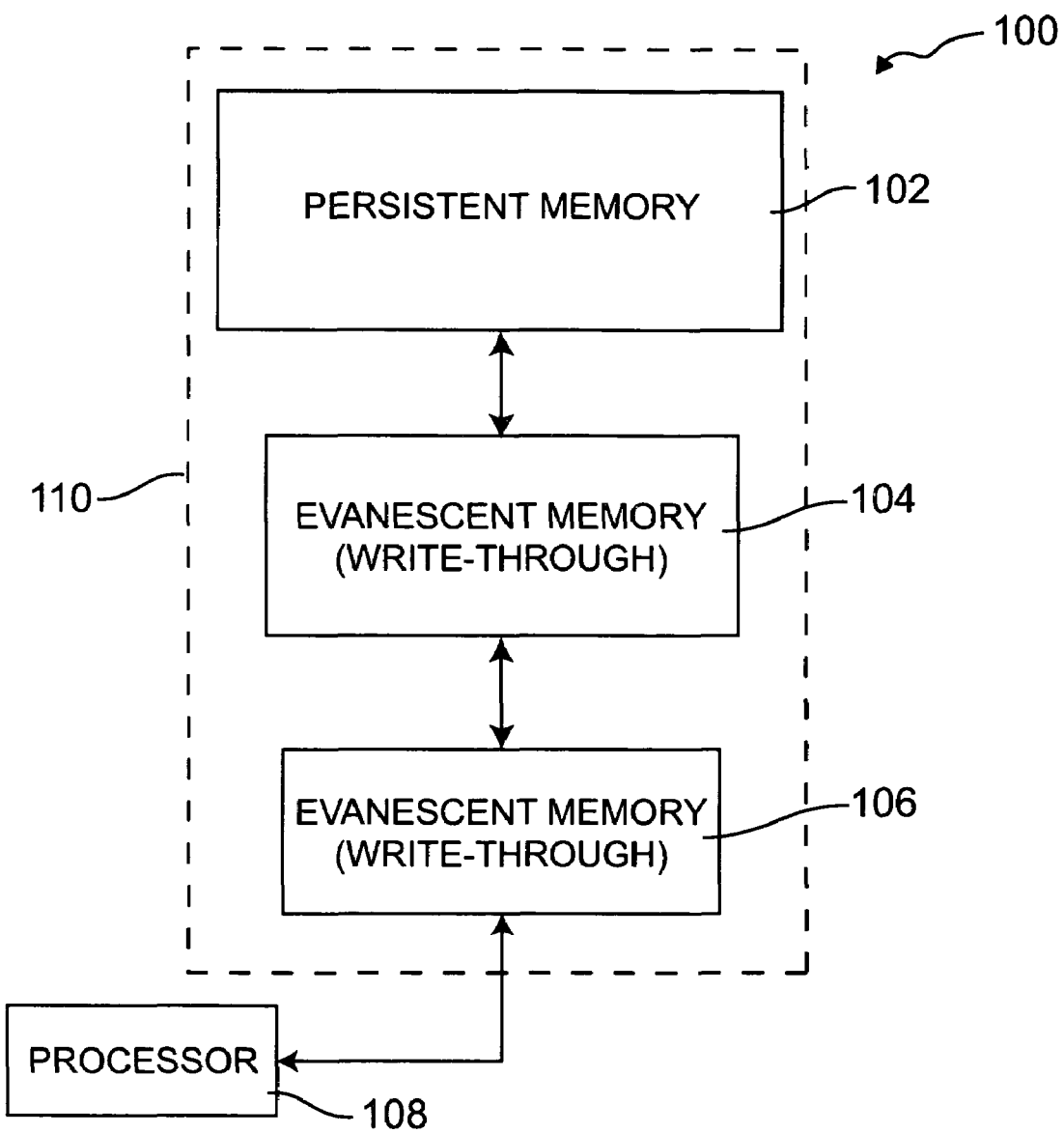
FIG. 1 is a block diagram illustrating an exemplary computing system in which the techniques of the present invention are implemented.

The present invention will be described herein in the context of an illustrative cache memory architecture employing DRAM. It should be appreciated, however, that the invention is not limited to this or any particular cache memory architecture. Rather, the invention is more generally applicable to techniques for advantageously detecting expired data in a dynamic cache memory, without requiring a periodic data refresh operation and related overhead necessary to implement and administer a periodic refresh methodology, as is required in standard dynamic memory architectures. Consequently, the cost of manufacturing the cache memory is beneficially reduced compared to conventional cache memory architectures.

Unlike main memory used, for example, in conjunction with a processor system, a cache is essentially a temporary buffer for holding frequently used data. With the exception of locally modified data, data within a cache is merely a copy of data that is held elsewhere (e.g., in main memory, on a hard disk, etc.). Accordingly, it is not essential that the data in a cache persist. Data in a cache that has not been referenced for a certain period of time may be considered to be "dead," meaning that it will likely be overwritten before it is referenced again. To periodically refresh all data in the cache, as is typically done in the context of dynamic memory used in a persistent storage application, is unnecessary in the context of a cache memory system and significantly overburdens processor system resources.

The use of DRAM integrated within a cache memory is known, as set forth in the Emma patent. As previously explained, Emma utilizes a restore tracking system for monitoring a total elapsed time since a given block of memory cells was last restored, so as to refresh one or more of the data entries having an expired status. The assumption had been that when data was allowed to expire, an administration operation (e.g., associated bookkeeping) had to be performed so that the processor, or alternative system, was aware of the fact that the data might be erroneous and therefore not attempt to use the data. The restore tracking system described in the Emma patent is primarily directed to an administered expiration methodology. The term "expiration" may be defined as a process by which data held in the dynamic memory is allowed to go unrefreshed, such that the logical states of corresponding dynamic memory cells may be disturbed and thus lost. However, while Emma represents an improvement over conventional DRAM refresh methodologies in that it reduces the frequency of refresh operations performed on the DRAM, the restore tracking system itself requires a substantial amount of overhead to implement, both in terms of actual hardware, and in system processing time.

The present invention, in accordance with illustrative embodiments thereof, provides methods and/or associated apparatuses for allowing a passive expiration of data held in dynamic memory. The term "passive expiration" as used herein is intended to refer to a methodology wherein an expiration of the data held in dynamic memory is not administered while it is in the process of expiring (e.g., while the data is still viable). Rather, the techniques of the present invention ensure that the processing system detects data that has expired when it attempts to use such data. Passive expiration does not subject the system to disruptions resulting from periodic refresh, nor does it require a mechanism for monitoring the amount of time that has elapsed since a given memory cell or cells has been refreshed. Essentially no special measures are taken either for data that is dead (e.g., not eventually used) or for valid data that could have expired (e.g., based on a worst-case statistical analysis) but has not expired. The passive expiration methodology of the present invention is tantamount to an improvement over conventional data refresh approaches, at least in that it allows increased flexibility with minimal processing and/or administrative overhead.

FIG. 1 is a block diagram illustrating an exemplary computing system 100 in which the techniques of the present invention can be implemented. As depicted, the computing system 100 includes a processor 108, coupled to a memory hierarchy 110 which may store, for example, program instructions and/or program data. The memory hierarchy 110 includes a first evanescent (e.g., temporary) memory 106, a second evanescent memory 104, and a persistent (e.g., main) memory 102. The persistent memory 102 is preferably inclusive, and hence maintains current copies of data written to evanescent memories 104, 106. In the exemplary computing system 100, data modified by the processor 108 preferably traverses (e.g., is written through) each level of the memory hierarchy 110, namely, the first and second evanescent memories 104, 106, to the persistent memory 102, for permanent storage. In a preferred embodiment of the invention, at least one of the evanescent memories 104, 106 comprises one or more DRAM, or alternative dynamic memory, functioning as a cache.

Since a permanent copy of data is maintained in the persistent memory 102, the data stored in evanescent memories 104, 106 can be allowed to expire, so long as a mechanism is provided to identify expired data. The present invention provides a means for managing the expiration of data in the evanescent memories 104, 106. While embodiments of the invention described herein specify the cache as an exemplary evanescent memory, other suitable buffer memories are similarly contemplated, as will be understood by those skilled in the art.

Figure 2A:
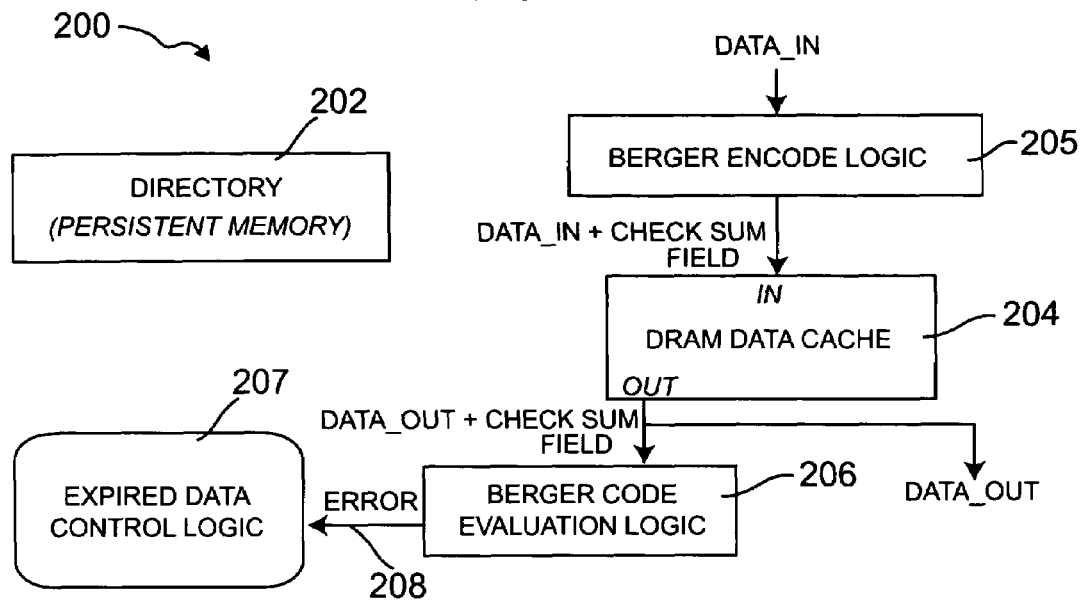
FIG. 2A is a block diagram illustrating an exemplary cache memory architecture employing a passive expiration methodology for detecting expired data stored in dynamic memory associated with the cache memory architecture, formed in accordance with one embodiment of the present invention.

FIG. 2A is a block diagram depicting an exemplary cache memory system 200, formed in accordance with one embodiment of the invention. The cache memory system 200 employs a passive expiration methodology for detecting expired data stored in dynamic memory associated with the cache memory system. The exemplary cache memory system 200 is suitable for use where only unidirectional errors are present and is, at least conceptually, perhaps one of the simplest architectures for implementing the passive expiration methodology of the invention. The term "unidirectional errors" as used herein may be defined as the set of errors representing either all one-to-zero errors or all zero-to-one errors, but not a mixture of the two types of errors. One-to-zero errors represent the situation in which an expected "1" bit, either through charge leakage or some other mechanism, is read as a logical "0." Likewise, zero-to-one errors represent the situation where an expected "0" bit is read as a logical "1." Many dynamic memories have an inherent preferred leakage path, causing charge to leak in substantially one direction only. Thus, the requirement that a particular cache memory system only be used with dynamic memory exhibiting unidirectional errors is not unreasonable. A methodology for handling bidirectional errors in a cache will be described below in conjunction with FIG. 2B.

In the illustrative cache memory system 200, the passive expiration methodology is based primarily on an error detection (and/or error correction) scheme. In a preferred embodiment of the invention, the error detection scheme comprises a Berger code, although the present invention is not limited to a Berger code. Expired data is preferably detected by evaluating Berger codes, for example using Berger code evaluation logic 206 included in the cache memory system 200. The cache memory system 200 further comprises a directory 202, which preferably holds requested addresses and indicates whether or not data corresponding to the addresses is stored in the cache memory system, Berger encode logic 205 configured for receiving an input data word, DATA_IN, from an external source (e.g., persistent memory), a DRAM data cache 204 having an input port (IN) coupled to the Berger encode logic 205, Berger code evaluation logic 206, or alternative error detection and/or correction circuitry, coupled to an output port (OUT) of the DRAM data cache 204, and expired data control logic 207 configured for receiving an error signal 208 generated by the Berger code evaluation logic 206.

For a subset of read operations initiated by fetch and/or store operations directed to the cache memory system 200, the Berger encode logic 205 preferably encodes the input data word DATA_IN by generating a checksum field based on the input data word and then appending the checksum field to the data word. The encoded data word (e.g., DATA_IN+checksum field) is then stored in the DRAM data cache 204. The Berger code evaluation logic 206 will retrieve data from the DRAM data cache 204 and will notify the expired data control logic 207 of an error in the retrieved data word by generating an error signal 208 when expired data is detected. In response to the error signal 208, the expired data control logic 207 preferably retrieves valid data from another level of cache memory and flushes the corresponding expired data from the DRAM data cache 204, as will be described in further detail in connection with the illustrative method depicted in FIG. 3.

As is known by those skilled in the art, a Berger code is a member of a class of weight-based codes, wherein each output bit of a given data word is assigned a weight (e.g., one), and check bits represent a sum of the weights of the output bits which have a value of one. Berger codes in general are described, for example, in J. M. Berger, "A Note on an Error Detection Code for Asymmetric Channels," *Inform. Contr.*, pp. 68-73, March 1961, which is incorporated by reference herein, and therefore will not be discussed in detail herein. While Berger codes themselves may not be a new concept, their use in the context of a passive expiration methodology for detecting expired data stored in a dynamic memory is new. It is to be understood, however, that other suitable alternative error detection and/or correction schemes may be employed in conjunction with the techniques of the invention.

In accordance with a preferred embodiment of the invention, the dynamic memory can be designed so that errors occurring from a lack of refresh, and in many cases, soft errors as well, will be unidirectional. The Berger code has the property that it will detect (but not correct) an arbitrary number of unidirectional errors. Construction of a Berger code is relatively straightforward, as will be known by those skilled in the art. The Berger code is preferably generated by the Berger encode logic 205 in the cache memory system 200. Specifically, for an n-bit data word, a sum of the 1's in the word is first calculated. Since there are at most n 1's in the n-bit data word, the sum can be represented in $\log_2(n)$ bits. A $\log_2(n)+1$-bit checksum is then generated which is a binary representation of a sum of the 1's in the data word. A binary inverse of the checksum forms a checksum field which is appended to the n-bit word DATA_IN. The Berger encoded data word is stored in the DRAM data cache 204.

By way of example only, and without loss of generality, assume a given word contains the data 1001 1101. The sum of the 1's in the data word is equal to five, which can be represented as 0101 in binary format. The checksum field would be the inverse of that, namely, 1010. The resulting Berger encoded data word would then be 1001 1101 1010, with the last four bits (1010) representing the checksum field. A loss of 1's in the data, for example, resulting from one or more unidirectional errors (e.g., one-to-zero), will lead to a smaller checksum, in this case, a sum of less than five. Since the stored checksum is inverted, a loss of 1's in the checksum field will result in a checksum field representation that is larger than the actual checksum.

In the above example, if the first 1 in the checksum field 1010 was lost, it would be read as 0010, which, when inverted, is the binary representation for 13. The checksum field would be larger than a recomputed checksum of the data word that is read, thus indicating an error somewhere in the word. Similarly, if we took the Berger-coded word 1001 1101 1010 and lost all of the 1's, the word would be read as 0000 0000 0000. The recomputed checksum on the data bits will indicate that there are no 1's, but the checksum field that we read (0000) indicates that there should be 15 1's, since the inverted checksum field would be 1111. Therefore, the Berger code successfully detects all of the unidirectional errors present in the data word.

Note, that in the above example, four checksum bits are required for an 8-bit word, so the overhead for a Berger code is relatively high for small words. However, by comparison, for a 32-bit word, only six checksum bits are needed, which requires approximately the same amount of overhead as for a byte parity methodology. Byte parity, however, cannot detect the number of errors in the data word. Furthermore, in comparison to an administered expiration of data methodology, as set forth in the Emma patent, having applied the Berger code to the data, there is essentially no administrative work for the system to do for data that was not modified locally. Therefore, for read-only data, and for any data in a store-through environment, this methodology is all that is required to successfully track expired data.

In generating the error signal 208, the Berger code evaluation logic 206 is preferably operative to: (i) to read the Berger encoded data word from the DRAM data cache 204; (ii) to perform a checksum on a data portion (e.g., the first eight bits) of the encoded data word read from the DRAM data cache; (iii) to compare the new checksum with a complement of the checksum field of the encoded data word read from the dynamic memory (e.g., the last four bits); and (iv) to generate the error signal when the new checksum does not substantially match the complement of the checksum field.

In accordance with the passive expiration techniques of the present invention, the stored data is not "timed-out" based, for instance, on a statistical model of charge leakage. Instead, when the processor reads data, it confirms that the Berger code is correct. When the Berger code is correct, then there is an assumption that no errors have occurred, indicating that the data is still valid and may therefore be used. In this instance, the checksum field is preferably stripped off and the remaining data is read out as data word Data_Out from the DRAM data cache 204. When an incorrect Berger code is detected, it is assumed that the data has become corrupted, such as, for example, by not having been refreshed within a data retention period of the memory cell (or via some soft-error mechanism, etc.), and the read is preferably treated as a cache miss, wherein the requested data is refetched from a higher level in the cache hierarchy (e.g., persistent memory).

Figure 2B:
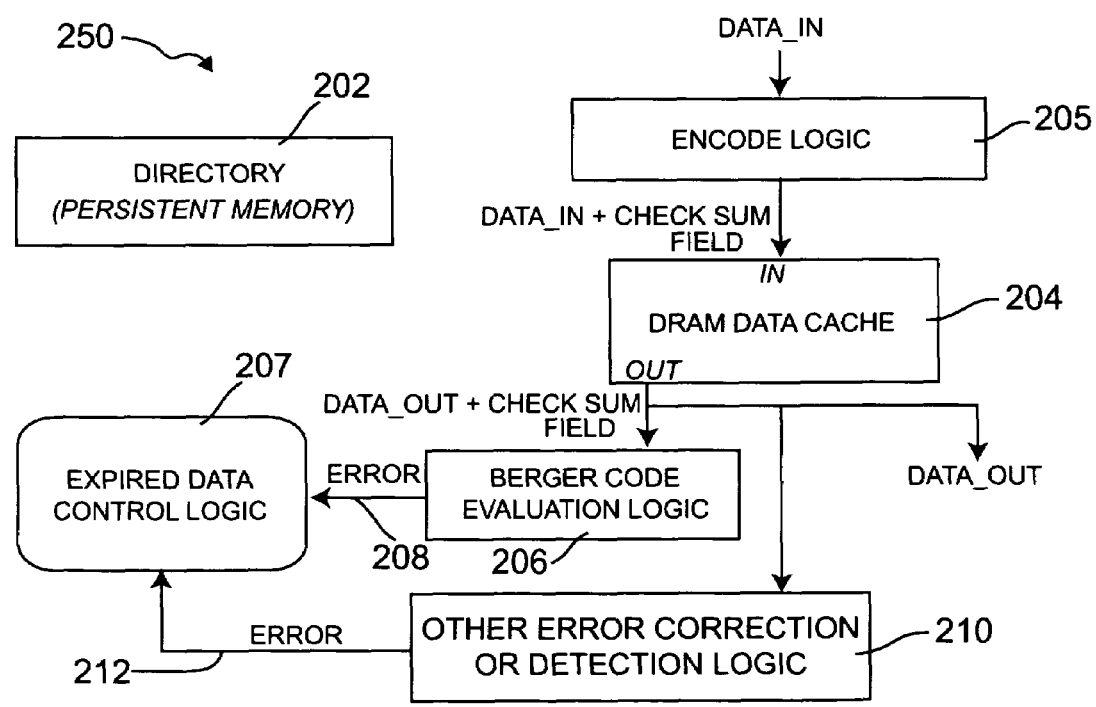
FIG. 2B is a block diagram illustrating an exemplary cache memory architecture employing a passive expiration methodology for detecting expired data stored in dynamic memory associated with the cache memory architecture, formed in accordance with a second embodiment of the present invention.

FIG. 2B is a block diagram depicting an exemplary cache memory system 250, formed in accordance with a second embodiment of the invention. The cache memory system 250, like cache memory system 200 shown in FIG. 2A, employs a passive expiration methodology for detecting expired data stored in dynamic memory associated with the cache memory system. Unlike cache memory system 200, however, the exemplary cache memory system 250 is suitable for use where bidirectional errors are present. Bidirectional errors, which are characteristic of static random access memory (SRAM), may be defined as a mixture of one-to-zero and zero-to-one errors (often referred to simply as "errors"). Hence, an implicit notion in existing cache literature, which is generally predicated on SRAM, is that errors are essentially always bidirectional. Bidirectional errors may be detected using, for example, standard parity check codes which will detect, although not necessarily locate, an odd number of errors. More powerful error correction codes can be designed which enable the correction of a fixed number of errors. However, as the number of correctable errors increases beyond one, the complexity of the corresponding overhead necessary to implement such error correction scheme increases significantly.

As depicted, the exemplary cache memory system 250 is similar to cache memory system 200 shown in FIG. 2A, with the addition of other error correction or detection logic 210. While both cache memory system 200 and cache memory system 250 exploit expired data control logic 207 to control the cache upon detection of expired data, only cache memory system 250 includes other error correction or detection logic 210 which is configured to identify one or more errors having a more general signature, namely, bidirectional errors resulting from, for example, inadequate noise margins, power supply glitches, radiation bombardment, etc. When an error is detected, the other error correction or detection block 210 generates an error signal 212 which is presented to the expired data control logic 207. The presumably invalid data may be treated as a cache miss by the expired data control logic 207.

Figure 3:
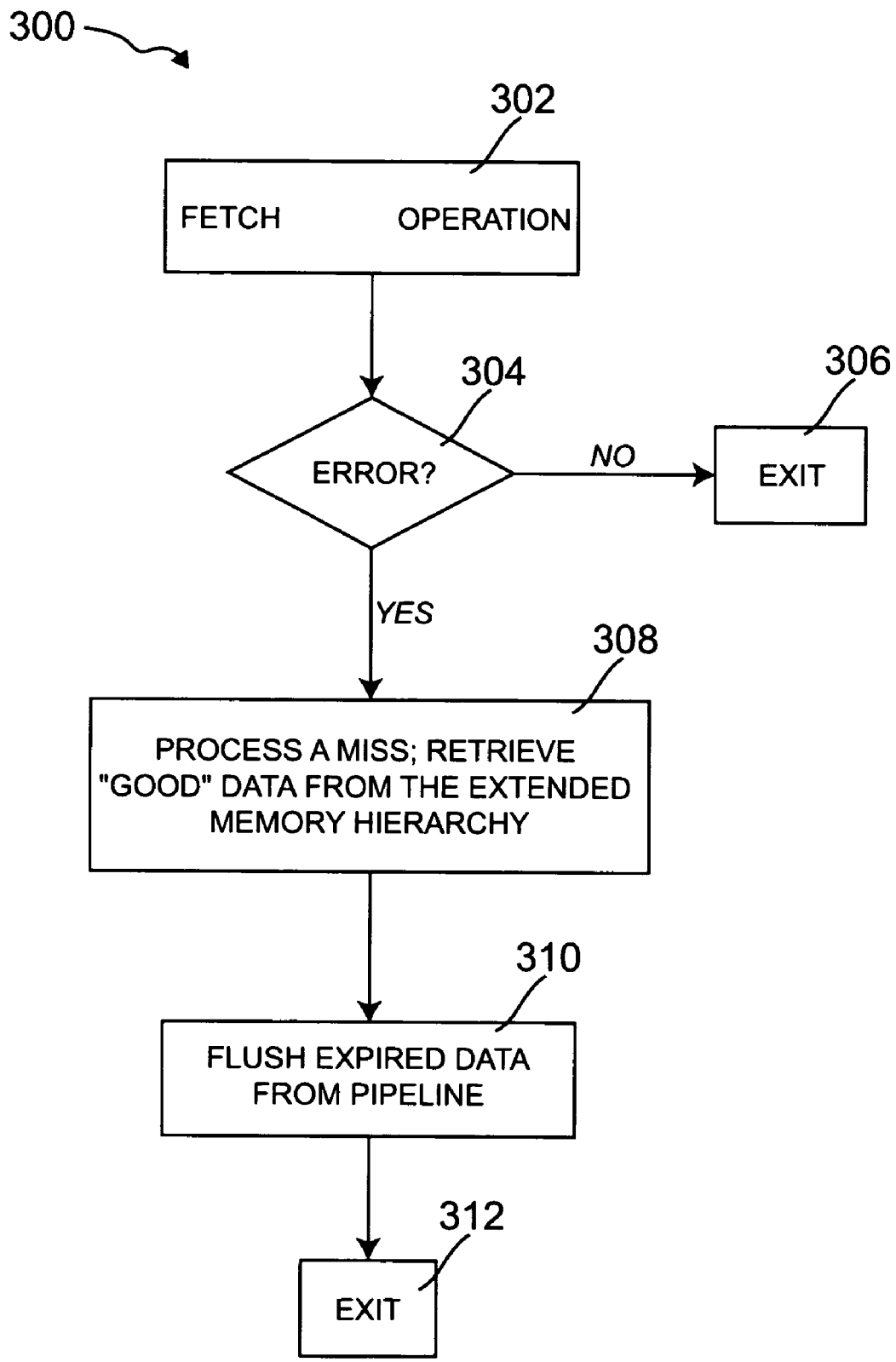
FIG. 3 is a logical flow diagram depicting an exemplary methodology for managing certain aspects of data flow, in accordance with the exemplary cache memory architectures shown in FIGS. 2A and 2B.

FIG. 3 is a logical flow diagram illustrating an exemplary process 300 for managing aspects of data flow, given a fetch request to a cache, in accordance with the first or second embodiment of the present invention shown in FIGS. 2A and 2B, respectively. Any fetch operation that, as part of the operation, reads data from the DRAM data cache 204 provides the Berger code evaluation logic 206 with the opportunity to determine whether or not the data has expired.

In step 302, a fetch operation from the DRAM data cache 204 initiates the expired data control logic 207 to perform exemplary process 300. Expired data causes the Berger code evaluation logic 206 to detect an error and generate the error signal 208 (or 212) for notifying the expired data control logic 207 so that the status of the data can be evaluated according to step 304. In step 304, at least one of two possible actions are taken. When an error has been detected, the control flow proceeds along the path marked "yes" to step 308, otherwise, the control flow proceeds along the path marked "no" to exit the process 300 according to step 306. When the data has expired, cache memory system 200 (or 250) processes a cache miss to retrieve valid (good) data from the extended memory hierarchy according to step 308. The cache miss request occurring in evanescent memory 106 of FIG. 1, for example, may traverse one or more levels of the memory hierarchy 110 (e.g., evanescent memory 104) to locate valid data in persistent memory 102. Meanwhile, the expired data must also be flushed from the cache pipeline according to step 310 to prevent the erroneous data from being used by the processing system. Finally, the process 300 exits at step 312.

Figure 4:
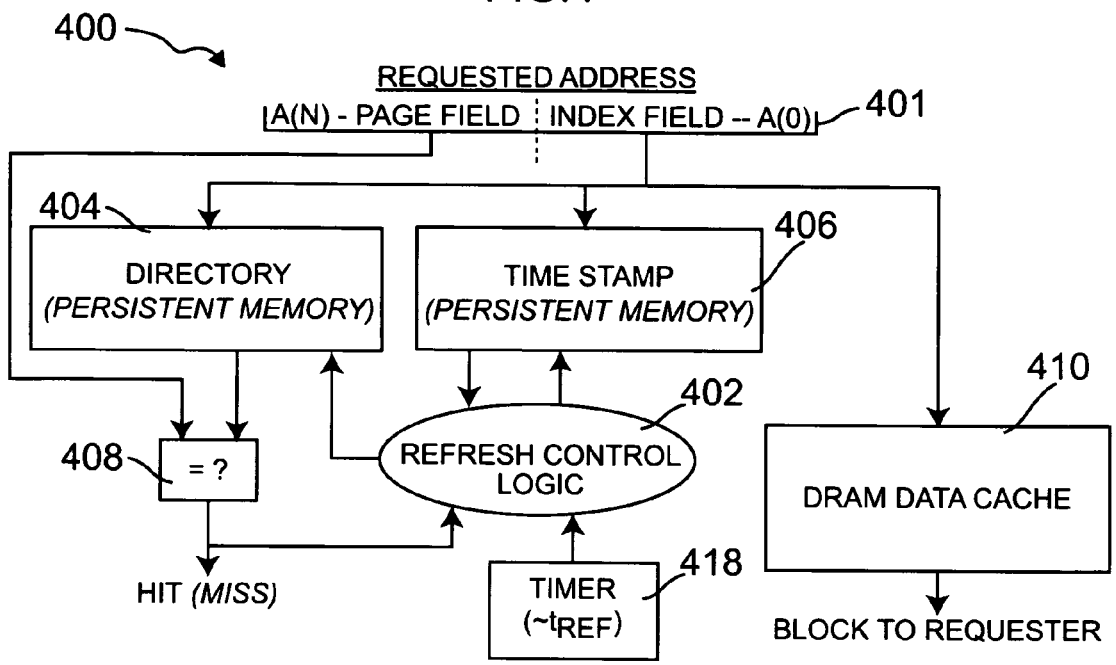
FIG. 4 is a block diagram illustrating an exemplary cache memory architecture employing a passive expiration methodology for detecting expired data stored in dynamic memory and which includes a time stamp apparatus, formed in accordance with a third embodiment of the present invention.

FIG. 4 is a block diagram depicting an exemplary cache memory system 400, formed in accordance with a third embodiment of the invention. The cache memory system 400, like the cache memory architectures shown in FIGS. 2A and 2B, employs a passive expiration methodology for detecting expired data stored in dynamic memory associated with the cache memory system. Cache memory system 400, like cache memory system 250, is configured to handle bidirectional errors. Cache memory system 400 preferably comprises a directory 404, which preferably holds requested addresses and indicates whether or not data corresponding to the addresses is stored in the cache memory system, a time stamp memory 406, which preferably holds refresh status bits, a timer 418, or alternative counter, a DRAM data cache 410, or alternative dynamic memory, hit logic 408, and refresh control logic 402. In contrast to the cache memory systems 200 and 250, cache memory system 400 does not employ Berger encoding. Rather, the passive expiration of data stored in DRAM is managed by a time stamp, as will be described in further detail below.

In accordance with the present invention, a time stamp associated with particular data in the cache validates whether or not the data has expired. Each time stamp requires at least one bit to implement. In order to save on implementation costs, it is contemplated that at least some of these same time stamp bits may also be utilized to track least recently used (LRU) ordering. As is known by those skilled in the art, the data within the cache will generally expire once a certain period of time, often referred to as the refresh time, $t_{REF}$, has elapsed without a refresh of the data. It should be noted that even though the data has expired for a read operation of given memory cells, and thus their contents are unavailable for use by a requesting processor, these same memory cells can still be written.

The status of the time stamp relating to a given dynamic memory cell is preferably updated/renewed after the corresponding data has been refreshed. Data is always refreshed after a write operation, and, in traditional DRAMs (e.g., a one-transistor, one-capacitor (1T1C) memory cell), a line is also refreshed via the write-back operation that typically follows a cache read operation. Data in the DRAM data cache 410 is kept refreshed by read or write operations directed to it. As long as the time elapsed between read or write operations directed to a particular line of memory cells in the DRAM data cache 410 does not exceed the refresh time $t_{REF}$, the data in the memory cells corresponding to that line remains valid. When data held in memory cells corresponding to a given line in the DRAM data cache 410 is no longer needed by a processor, such as, for example, when the line of memory cells has not been referenced for a significant number of clock cycles, the data can be allowed to expire within the DRAM data cache without any substantial impact to overall system performance. Expired data lines within a DRAM-based cache do not consume any significant energy.

Figure 5:
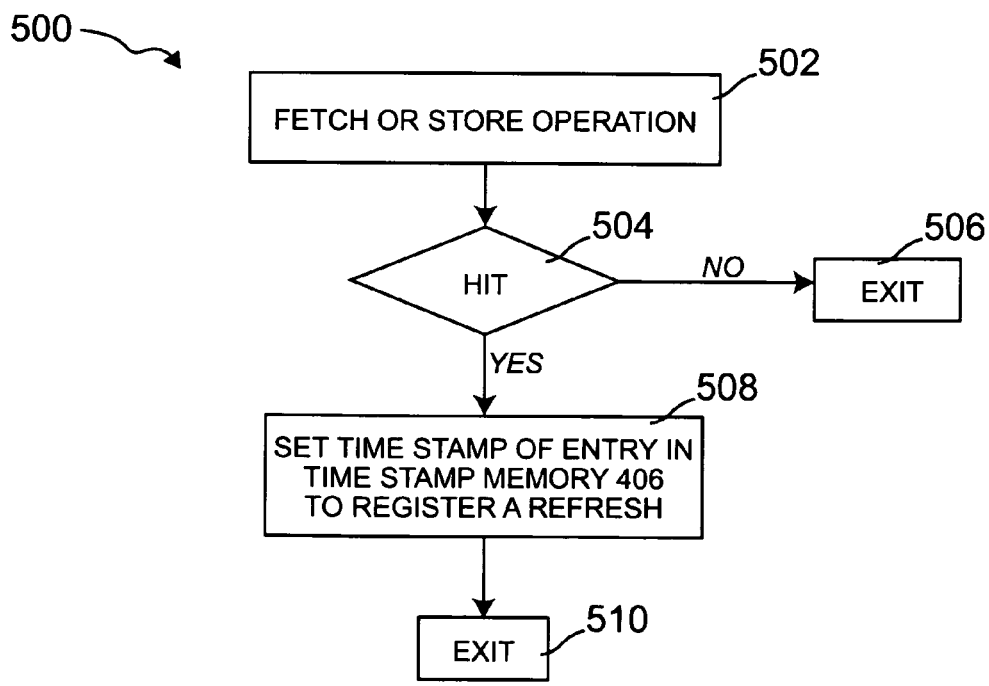
FIG. 5 is a logical flow diagram depicting an exemplary methodology for setting time stamps used for tracking a refresh status of data, in accordance with the illustrative embodiment of the present invention shown in FIG. 4.

Operation of the exemplary cache memory system 400 will now be described. The time stamp memory 406 preferably stores one or more refresh status bits for tracking a refresh status of a corresponding data entry stored in the DRAM data cache 410. As previously mentioned, a read or write operation refreshes the logical state of data stored in memory cells of the DRAM data cache 410. Two logical flow diagrams depicting illustrative refresh tracking methodologies 500 and 600, which may be performed by the refresh control logic 402 to manage the refresh status bits within the time stamp memory 406, are shown in FIGS. 5 and 6, respectively. Exemplary refresh tracking methodology 500 depicted in FIG. 5 may be invoked by a fetch or store operation directed to the cache memory system 400, while exemplary refresh tracking methodology 600 shown in FIG. 6 may be invoked by the timer 418 which tracks the refresh time. Refresh tracking methodology 500 preferably stores a refresh credit in the time stamp memory 406 for a DRAM entry having undergone a refresh in a recent, or most recent, time window. Refresh tracking methodology 600 resets the refresh status after a certain time period has elapsed, the time period preferably relating to a data retention time $t_{RET}$ (e.g., $t_{RET} \cong 60$ milliseconds (ms)) of a given memory cell in the DRAM data cache 410.

With reference now to FIG. 5, there is shown an exemplary refresh tracking methodology 500 for setting time stamps used for tracking the refresh status of data, given a fetch or store request to the DRAM data cache 410, in accordance with the illustrative cache memory system 400 depicted in FIG. 4. The exemplary refresh tracking methodology 500 may be performed, for example, by the refresh control logic 402. It is to be understood that in exemplary methodology 500, the DRAM data cache 410 is assumed to be accessed only after the directory 404 has been searched and a match (hit), indicating that the DRAM data cache 410 holds the requested data, has been validated.

As apparent from the figure, the fetch or store operation, in response to receiving a requested address 401, initiates the refresh tracking methodology 500 at step 502. Step 504 determines whether or not a cache "hit" has occurred. A cache hit occurs when the requested address 401 matches the directory entry and the data stored in the DRAM data cache 410 is valid. When a hit occurs, control flow proceeds along the path marked "yes" to step 508. When a hit does not occur, referred to as a cache "miss," control flow proceeds along the path marked "no" to step 506, where the methodology 500 exits at step 506. No credit for a refresh is awarded if the DRAM data cache 410 is never actually accessed. Step 508 credits the time stamp with a refresh for a hit because the DRAM data cache 410 is accessed. After the time stamp corresponding to the particular data entry has been set in the time stamp memory 406, the methodology 500 exits at step 510.

The assumption that the directory 404 is searched for an address match (a hit) before the DRAM data cache 410 is accessed governs the structure of the logic depicted in refresh tracking methodology 500, as will be understood by those skilled in the art. For example, where both the DRAM data cache 410 and the directory 404 are accessed substantially in parallel, as is true for some high performance cache memory hierarchies, step 504 in the illustrative refresh tracking methodology 500 need not be performed, since an entry in the DRAM data cache 410 would have been read and hence refreshed regardless of the hit logic status. Upon any fetch or store operation in this case, the time stamp would always register a refresh according to step 508.

With reference now to FIG. 6, there is shown an exemplary refresh tracking methodology 600 for resetting time stamps used for tracking the refresh status of data and for invalidating directory entries corresponding to such data, in accordance with another aspect of the invention. It is to be appreciated that the invention is not limited to the specific methodology shown, and that other suitable alternative methods for tracking the refresh status of data in the cache are similarly contemplated, as will be known by those skilled in the art. As previously stated, refresh tracking methodology 600 is not invoked in response to a fetch or store operation directed to the cache memory system 400, as in the case of methodology 500 discussed above. Rather, refresh tracking methodology 600 is invoked in response to the timer 418 reaching a prescribed limit, which preferably relates to the data retention time $t_{REF}$ of DRAM memory cells in the DRAM data cache 410.

When the timer 418 reaches the prescribed limit at step 602, which may be approximately equal to half the data retention time $t_{RET}$, a count variable I is defined and initialized to zero in step 604. The count variable I may be used to identify the particular entry in the time stamp memory 406 that is processed each time through a loop within refresh tracking methodology 600. At step 606, the count variable I is incremented by one, and control flow proceeds to step 608. At step 608, entry(I), which may be defined as an entry in the time stamp memory 406 corresponding to the count variable I, is read to determine a refresh status of a corresponding entry in the DRAM data cache 410. In preparation for the next refresh monitoring time window, step 610 resets entry(I) in the time stamp memory 406 to indicate that no refresh has occurred. It should be noted that the refresh status may only be updated to reflect that a refresh has occurred in a given refresh monitoring time window by invoking exemplary refresh tracking methodology 500 through a fetch or store operation according to step 502.

After resetting entry(I) in time stamp memory 406, process flow continues to step 612, which determines whether or not the entry(I) reported a refresh occurring in step 608. When a refresh has not occurred, control flow proceeds along the path marked "no" to step 616, where the corresponding directory entry (or entries) are invalidated. Control flow then continues to step 618, where the count variable I is evaluated to determine whether or not the total number of entries have been read. When step 612 indicated that a refresh has occurred in the previous refresh monitoring time window, nothing needs to be done, and therefore control flow proceeds along the path marked "yes" to step 618. In step 618, when the total number of entries has not been read, control flow proceeds along the path marked "no" to step 606, where the count variable I is incremented by one and the process continues as described above. When step 618 determines that all entries have been read, control flow continues along the path marked "yes" to step 620, where timer 408 is initialized and started. The process 600 then exits at step 624.

It is important to recognize that the aforementioned illustrative embodiments employing passive expiration for data refresh do not interrupt the cache memory for performing a periodic refresh operation. Instead, these cache memory systems rely on the intrinsic read and write restore mechanisms of DRAM to refresh only the state of those lines actively used by a processor. Potential benefits include, but are not limited to, reduction of power consumption, reduction of refresh time, and reduction of storage capacitor size (hence fabrication costs).

At least a portion of the dynamic cache memory system of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. Apparatus for passively tracking expired data in a dynamic memory, the apparatus comprising:
    an error encoding circuit, the error encoding circuit being operative to receive an input data word and to generate an encoded data word which is stored in the dynamic memory;
    a first decoding circuit, the first decoding circuit being operative to receive an encoded data word from the dynamic memory, to detect at least one or more unidirectional errors in the input data word read from the dynamic memory, and to generate a first error signal when at least one error is detected, the first error signal indicating that the input data word read from the dynamic memory comprises expired data; and
    control circuitry configured for initiating one or more actions in response to the first error signal.

2. The apparatus of claim 1, wherein the error encoding circuit comprises weight-based error encoding logic.

3. The apparatus of claim 1, wherein the encoding circuit comprises Berger encode logic, the Berger encode logic being configurable for generating a checksum field based on the input data word and for appending the checksum field to the input data word for storage in the dynamic memory.

4. The apparatus of claim 3, wherein the checksum field comprises a complement of a binary representation of a sum of a number of logical 1's in the input data word.

5. The apparatus of claim 1, wherein the dynamic memory comprises at least one dynamic random access memory cache.

6. The apparatus of claim 1, wherein the first decoding circuit comprises Berger code evaluation logic, the Berger code evaluation logic being operative: (i) to read the encoded data word from the dynamic memory; (ii) to compute a checksum on a data portion of the encoded data word read from the dynamic memory; (iii) to compare the checksum with a complement of the checksum field of the encoded data word read from the dynamic memory; and (iv) to generate the first error signal when the computed checksum does not substantially match the complement of the checksum field.

7. The apparatus of claim 1, wherein the first decoding circuit comprises at least one of error detection circuitry and error correction circuitry.

8. The apparatus of claim 1, wherein the control circuitry, in response to the first error signal generated by the first decoding circuit, is operative to retrieve valid data corresponding to the input data word from a second memory external to the dynamic memory.

9. The apparatus of claim 8, wherein the control circuitry is further operative to delete the expired data from the dynamic memory.

10. The apparatus of claim 1, further comprising at least a second decode circuit, the second decode circuit comprising at least one of an error detection circuit and an error correction logic for detecting and correcting, respectively, one or more errors in the data word read from the dynamic memory, the second decode circuit generating a second error signal indicating that the data word read from the dynamic memory comprises expired data, the control circuitry initiating one or more actions in response to at least one of the first and second error signals.

11. The apparatus of claim 10, wherein the first and second decode circuits, in conjunction with one another, are being configurable for detecting one or more bidirectional errors in the data word read from the dynamic memory.

12. The apparatus of claim 10, wherein the second decode circuit comprises parity check logic.

13. The apparatus of claim 1, further comprising a directory configurable for storing one or more addresses corresponding to one or more data entries stored in the dynamic memory.

* * * * *